(12) United States Patent
Fischer et al.

(10) Patent No.: US 11,118,908 B2
(45) Date of Patent: Sep. 14, 2021

(54) STRUCTURE-BORNE NOISE DECOUPLING ON SENSORS WORKING WITH TRANSMITTER FIELDS

(71) Applicant: Continental Teves AG & Co. oHG, Frankfurt (DE)

(72) Inventors: Thomas Fischer, Frankfurt am Main (DE); Jakob Schillinger, Gaimersheim (DE); Dietmar Huber, Rödermark (DE); Stefan Günthner, Frankfurt am Main (DE); Lothar Biebricher, Oberursel (DE); Michael Schulmeister, Groß-Zimmern (DE)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 112 days.

(21) Appl. No.: 15/323,845

(22) PCT Filed: Jun. 25, 2015

(86) PCT No.: PCT/EP2015/064419
§ 371 (c)(1),
(2) Date: Jan. 4, 2017

(87) PCT Pub. No.: WO2016/005202
PCT Pub. Date: Jan. 14, 2016

(65) Prior Publication Data
US 2017/0146345 A1 May 25, 2017

(30) Foreign Application Priority Data
Jul. 8, 2014 (DE) .................... 10 2014 213 217.7

(51) Int. Cl.
*G01P 15/00* (2006.01)
*B81B 7/00* (2006.01)
(Continued)

(52) U.S. Cl.
CPC ......... *G01C 19/5733* (2013.01); *B60W 10/06* (2013.01); *B60W 10/184* (2013.01);
(Continued)

(58) Field of Classification Search
None
See application file for complete search history.

(56) References Cited

U.S. PATENT DOCUMENTS 4,803,544 A  2/1989  Holzschuh
5,122,860 A *  6/1992  Kikuchi ................. B42D 25/47
                                              257/679

(Continued)

FOREIGN PATENT DOCUMENTS

CN        1290379 A      4/2001
CN      102196605 A      9/2011
(Continued)

OTHER PUBLICATIONS

Chinese Office Action for Chinese Application No. 201580036814.3, dated Aug. 7, 2018, with translation, 10 pages.
(Continued)

*Primary Examiner* — Jill E Culler
*Assistant Examiner* — Ruben C Parco, Jr.
(74) *Attorney, Agent, or Firm* — RatnerPrestia

(57) ABSTRACT

A sensor for sensing a physical transmitter field dependent on a physical quantity to be measured, including: a sensor circuit for sensing the transmitter field and for outputting a sensor signal dependent on the transmitter field a circuit carrier having a first region in which at least a part of the sensor circuit is supported and a second region in which at least a first mechanical interface and a second mechanical interface for connecting the circuit carrier to a retainer are arranged, and a noise resistance element, which is arranged between the first region and the second region and which is (Continued)

designed to conduct structure-borne noise entering via the first mechanical interface to the second mechanical interface.

9 Claims, 7 Drawing Sheets

(51) Int. Cl.
    *G01C 19/5733* (2012.01)
    *G01D 11/30* (2006.01)
    *G01D 11/10* (2006.01)
    *B60W 10/06* (2006.01)
    *B60W 10/184* (2012.01)
    *B60W 30/02* (2012.01)
    *G01C 19/5769* (2012.01)
    *G01P 1/00* (2006.01)
    *G01P 15/08* (2006.01)

(52) U.S. Cl.
    CPC ......... *B60W 30/02* (2013.01); *G01C 19/5769* (2013.01); *G01D 11/10* (2013.01); *G01D 11/30* (2013.01); *G01P 1/003* (2013.01); *G01P 15/08* (2013.01); *B60W 2520/105* (2013.01); *B60W 2520/14* (2013.01); *B60W 2720/00* (2013.01); *B81B 7/0016* (2013.01); *G01P 2015/0882* (2013.01); *H01L 2224/48137* (2013.01); *H01L 2224/49171* (2013.01)

(56) References Cited

U.S. PATENT DOCUMENTS

| | | | |
|---|---|---|---|
| 5,223,738 A | | 6/1993 | Okada |
| 5,438,859 A | * | 8/1995 | Yamashita ............... G01P 1/006 73/1.38 |
| 5,686,757 A | | 11/1997 | Urushima |
| 6,737,736 B2 | | 5/2004 | Abe |
| 6,867,483 B2 | | 3/2005 | Huat |
| 7,781,876 B2 | | 8/2010 | Theuss |
| 8,794,067 B2 | | 8/2014 | Schmid |
| 8,820,160 B2 | | 9/2014 | Doering |
| 9,014,921 B2 | | 4/2015 | Bretzigheimer |
| 9,222,955 B2 | | 12/2015 | Hoefer |
| 2002/0105061 A1 | * | 8/2002 | Abe ................... H01L 23/49575 257/666 |
| 2005/0017330 A1 | * | 1/2005 | Diot .................. H01L 23/49861 257/666 |
| 2008/0251904 A1 | | 10/2008 | Theuss et al. |
| 2009/0282915 A1 | | 11/2009 | Ohta |
| 2011/0219873 A1 | * | 9/2011 | Ohta ....................... G01C 19/56 73/504.12 |
| 2012/0112368 A1 | | 5/2012 | Gorai |
| 2013/0008250 A1 | | 1/2013 | Koc |
| 2013/0068020 A1 | * | 3/2013 | Aono ................... B81C 1/00293 73/504.12 |
| 2013/0199295 A1 | | 8/2013 | Hoefer et al. |
| 2014/0055974 A1 | * | 2/2014 | Hansen .................... H05K 1/14 361/804 |
| 2015/0351252 A1 | | 12/2015 | Biebricher |

FOREIGN PATENT DOCUMENTS

| | | | |
|---|---|---|---|
| DE | 3623419 | 1/1988 | |
| DE | 10142585 | 9/2002 | |
| DE | 10154855 | 5/2003 | |
| DE | 102004015474 | 12/2004 | |
| DE | 102004022808 | 12/2005 | |
| DE | 102004022831 | 12/2005 | |
| DE | 102004039924 | 2/2006 | |
| DE | 102007017641 | 10/2008 | |
| DE | 102010002796 | 9/2010 | |
| DE | 102010000848 | 7/2011 | |
| DE | 102011080789 | 2/2012 | |
| DE | 102012201486 | 8/2013 | |
| DE | 102013202212 | 8/2013 | |
| DE | 102012223982 | 6/2014 | |
| EP | 1048006 B1 | 6/2004 | |
| EP | 2187168 A1 * | 5/2010 | ........... B81B 7/0058 |
| JP | 2009103530 A * | 5/2009 | |
| WO | 2010037810 | 4/2010 | |

OTHER PUBLICATIONS

Neul, R., et al., "Micromachined Angular Rate Sensors for Automotive Applications," Feb. 2007, pp. 302-309, vol. 7(2), Sensors Journal, IEEE, (abstract only), 1 page.

International Search Report and Written Opinion for International Application No. PCT/EP2015/064419, dated Sep. 14, 2015, 7 pages.

German Search Report for German Application No. 10 2014 213 217.7, dated May 6, 2015, including partial English translation, 8 pages.

European Examination Report for European Application No. 15 732 631.5, dated Dec. 21, 2017, 8 pages.

* cited by examiner

STRUCTURE-BORNE NOISE DECOUPLING ON SENSORS WORKING WITH TRANSMITTER FIELDS

CROSS REFERENCE TO RELATED APPLICATIONS

This application is the U.S. National Phase Application of PCT/EP2015/064419, filed Jun. 25, 2015, which claims priority to German Patent Application No. 10 2014 213 217.7, filed Jul. 8, 2014, the contents of such applications being incorporated by reference herein.

FIELD OF THE INVENTION

The invention relates to a sensor for sensing a physical transmitter field which is dependent on a physical variable to be measured.

BACKGROUND OF THE INVENTION

WO 2010/037 810 A1, which is incorporated by reference discloses a sensor having a sensor circuit which is configured to output a sensor signal which is dependent on a physical variable to be measured, via a physical transmitter field which is dependent on the physical variable to be measured.

SUMMARY OF THE INVENTION

An aspect of the invention is to improve this sensor.

According to one aspect of the invention, a sensor for sensing a physical transmitter field which is dependent on a physical variable to be measured comprises a sensor circuit for sensing the transmitter field and for outputting a sensor signal which is dependent on the transmitter field, a circuit carrier having a first region in which at least part of the sensor circuit is supported, and a second region in which at least a first mechanical interface and a second mechanical interface for connecting the circuit carrier to a retainer are arranged, and a noise-resistance element which is arranged between the first region and the second region and is configured to conduct structure-borne noise entering via the first mechanical interface to the second mechanical interface.

The specified sensor is based on the idea that sensors, such as the specified sensors, are usually used in environments in which structure-borne noise oscillations occur owing to other electrical components such as, for example, capacitors or other mechanical components such as, for example, actuators. These structure-borne noise oscillations can move the sensor circuit and therefore influence not only the actual physical transmitter field but also the sensor signal and therefore falsify the measurement of the physical variable to be measured. This can be observed, in particular, in the case of inertial sensors in which the physical transmitter field constitutes the physical variable which is actually to be measured, such as, for example, the accelerations of a vehicle in the spatial axes.

This is where the specified sensor comes in with the proposal that the structure-borne noise is not to be allowed to penetrate as far as the sensor circuit but instead is to be conducted as far as possible past the sensor circuit. This is achieved by virtue of the fact that the sensor is divided into two regions, wherein the first region at least partially supports the sensor circuit, and the second region is connected to the surroundings, such as, for example, a vehicle, in which the physical variable which is to be measured is to be sensed. A noise-resistance element between these two regions acts like a wall for the structure-borne noise which enters the second region, with the result that the structure-borne noise remains true to the principle that it will always follow the path with the least resistance and moves past the wall and exits again from the second region.

Therefore, the structure-borne noise does not occur at the noise-resistance element and therefore cannot influence the measurement of the physical variable to be measured. As a result, the measurement of the physical variable to be measured becomes significantly more precise.

In one development of the specified sensor, the circuit carrier is embodied as a leadframe, and the noise-resistance element is embodied as a slit in the leadframe. A leadframe is a circuit carrier whose conductor tracks are formed by means of cutting methods, such as punching, from a plate-shaped basic material. In this context, the noise-resistance element which is embodied as a slit can also be formed within the scope of a cutting method such as punching, with the result that the noise-resistance element can be manufactured with the same tools as the circuit carrier itself and therefore no relatively large manufacturing costs are incurred for the implementation of the noise-resistance element.

In one particular development of the specified sensor, the slit is designed to run around the first region, and the second region is connected to the first region via at least one web. As a result of the slit which runs around, the first region in which the sensor circuit is arranged is mounted in a virtually floating fashion with respect to the second region, wherein owing to the principle involved a negligibly small sound bridge, the at least one web, remains over which structure-borne noise can still penetrate from the second region into the first region. At the same time, this floating support damps further the structure-borne noise which penetrates the first region because the penetrating structure-borne noise can cause the first region to oscillate less strongly owing to its mechanical inertia and the floating support.

In another embodiment, preferably in order to assist the floating support of the structure-borne noise the specified sensor can comprise a mechanical decoupling element which encapsulates the first region of the circuit carrier, the sensor circuit and at least partially the noise-resistance element which is preferably embodied as the previously mentioned slit. By means of the mechanical decoupling element, the floating support explained above can be assisted further, wherein the mechanical decoupling element can also damp other sound waves which are not brought about by structure-borne noise.

For this purpose, the mechanical decoupling element should be a material which is as soft as possible. Within the scope of one expedient development of the specified sensor, the mechanical decoupling element could comprise a silicone mass which is particularly cost-effective but satisfies all the necessary requirements for noise decoupling of the second region from the first region of the specified sensor.

In order to improve the noise decoupling further, in a particular development the mechanical decoupling element of the specified sensor could comprise a noise-decoupling film on which the first region of the circuit carrier is supported. Then, for example the silicone mass could be sprayed onto the side of the circuit carrier lying opposite the noise-decoupling film, which can be implemented with high precision and in a simple fashion with mass production methods. The first region of the circuit carrier would then be accommodated between the silicone mass and the noise-decoupling film, as in a sandwich.

In an additional development of the specified sensor, an electrical reference potential is applied to at least one of the two mechanical interfaces. In this way, the mechanical interface, which is, in any case, connected to the first region of the circuit carrier and therefore to the sensor circuit, for example via the web mentioned above, can also be used to implement an electrical function.

Furthermore, in yet another development the sensor can comprise a decoupling component such as, for example, a noise-decoupling film which can be the same as or different than the noise-decoupling film mentioned above. That is to say, for example, part of the sensor circuit, such as, for example, the measuring pickup or pickups of the sensor circuit, can be supported directly on the noise-decoupling film mentioned above. Then, for example a recess in which this part of the sensor circuit is then inserted could be formed in the circuit carrier. In this way, the noise decoupling can be increased further.

The specified sensor can be enclosed in a protective mass, for example made of thermoset, by which the specified sensor can be largely protected against weather phenomena.

The specified sensor can be a wheel speed sensor or an inertial sensor for a vehicle.

According to a further aspect of the invention, a vehicle comprises a specified sensor.

BRIEF DESCRIPTION OF THE FIGURES

The properties, features and advantages of this invention described above, and the way in which they are achieved, become clearer and more easily understandable in conjunction with the following description of the exemplary embodiments which are explained in more detail in conjunction with the drawings, in which.

DETAILED DESCRIPTION OF THE PREFERRED EMBODIMENTS

In the figures, identical technical elements are provided with the same reference numbers and described only once.

Figure 1:
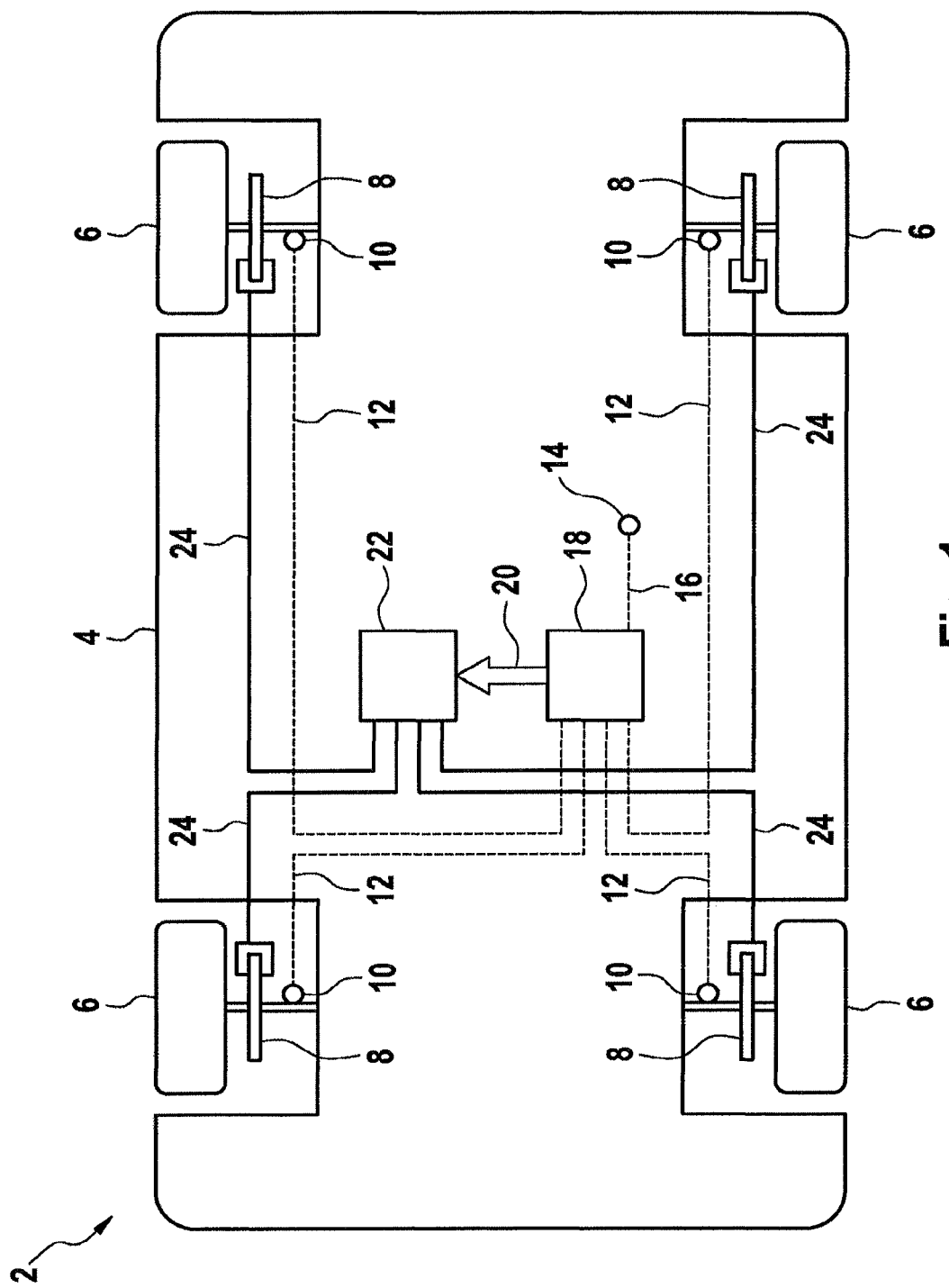
FIG. 1 shows a schematic view of a vehicle having a vehicle movement dynamics control system.

Reference is made to FIG. 1 which shows a schematic view of a vehicle 2 with a vehicle movement dynamics control system which is known per se. Details on this vehicle movement dynamics control system can be found, for example, in DE 10 2011 080 789 A1, which is incorporated by reference.

The vehicle 2 comprises a chassis 4 and four wheels 6. Each wheel 6 can be slowed down with respect to the chassis 4 by means of a brake 8 which is attached in a positionally fixed fashion to the chassis 4, in order to slow down a movement of the vehicle 2 on a road (not illustrated further).

In this context, it can be found, in a manner known to a person skilled in the art, that the wheels 6 of the vehicle 2 lose their grip and the vehicle 2 even moves away from a trajectory, predefined, for example, by means of a steering wheel (not shown further) as a result of understeering or oversteering. This is avoided by control loops, which are known per se, such as ABS (anti-lock brake system) and ESP (electronic stability program).

In the present embodiment, the vehicle 2 has for this purpose rotational speed sensors 10 on the wheels 6 which sense a rotational speed 12 of the wheels 6. In addition, the vehicle 2 has an inertial sensor 14 which senses inertial data, referred to below as vehicle movement dynamics data 16, of the vehicle 2, which data can comprise, for example, a pitching rate, a rolling rate, a yaw rate, a lateral acceleration, a longitudinal acceleration and/or a vertical acceleration of the vehicle 2.

On the basis of the sensed rotational speeds 12 and vehicle movement dynamics data 16, a controller 18 can determine, in a manner known to a person skilled in the art, whether the vehicle 2 is slipping on the underlying surface or is even deviating from the abovementioned predefined trajectory and can correspondingly react thereto with a controller output signal 20 which is known per se. The controller output signal 20 can then be used by an actuation device 22 in order to actuate, by means of actuation signals 24, actuating elements such as the brakes 8 which react to the slipping and the deviation from the predefined trajectory in a manner known per se.

The controller 18 can be integrated, for example, into an engine controller, known per se, of the vehicle 2. The controller 18 and the actuation device 22 can also be embodied as a common control device and optionally integrated into the engine controller mentioned above.

Figure 2:
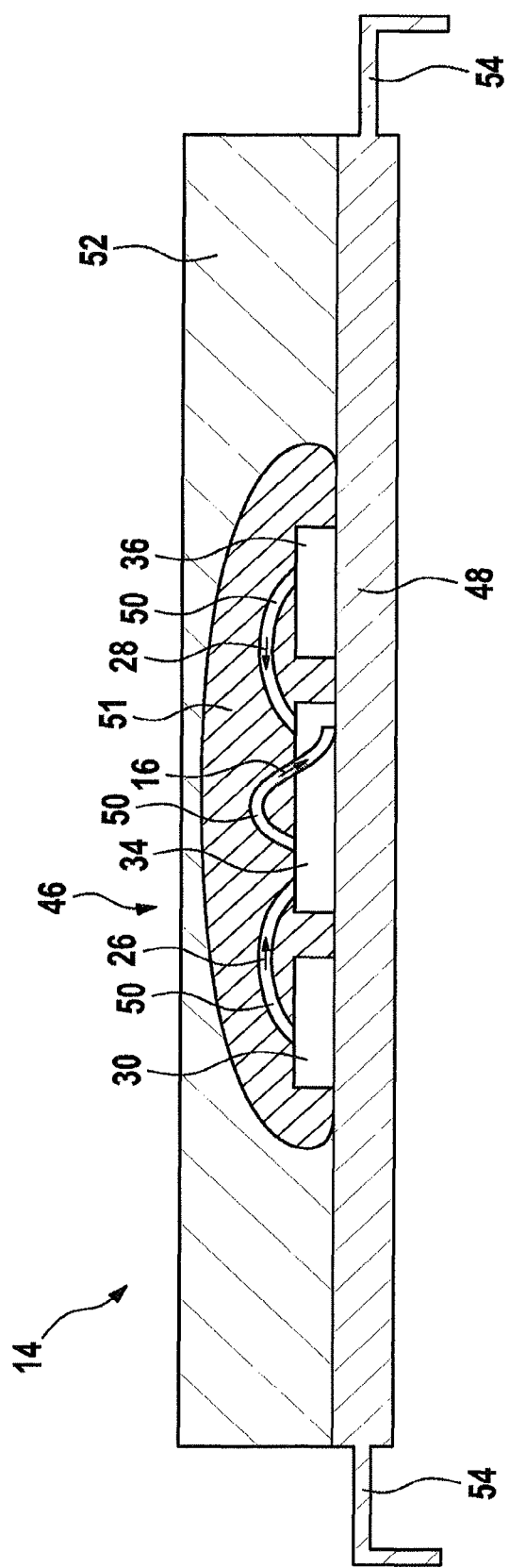
FIG. 2 shows a schematic illustration of an inertial sensor in the vehicle in FIG. 1.

In order to simplify the explanations below, it should be assumed, in a non-restrictive fashion, that the inertial sensor 14 senses, as vehicle movement dynamics data 16, the lateral acceleration 26 which is indicated in FIG. 2 and which acts on the vehicle and the yaw rate 28 with which the vehicle 2 rotates about its vertical axis because these are usually used within the scope of the stability program mentioned above.

Although the invention has been explained in more detail with reference to the inertial sensor 14, the invention can be applied to any desired sensors such as, for example, the specified rotational speed sensors 10.

A possible principle for the inertial sensor 14 will be explained in more detail below with reference to FIG. 2.

In order to sense the lateral acceleration 26, a lateral acceleration measuring pickup 30 is arranged in the inertial sensor 14. The lateral acceleration measuring pickup 30 is subjected to a physical transmitter field in the form of a centrifugal force field 32 which acts on the lateral acceleration measuring pickup 30 and accelerates with the lateral acceleration 26 which is to be sensed and which acts on the vehicle 2. The sensed lateral acceleration 26 is subsequently output to a signal conditioning circuit 34.

In order to sense the yaw rate 28, a coriolis acceleration measuring pickup 36 is arranged in the inertial sensor 14. The coriolis acceleration measuring pickup 36 is subjected to a physical transmitter field in the form of a coriolis force field 38. In response to the coriolis force field 38, the coriolis acceleration measuring pickup 36 outputs a transmitter signal 40 which then can be converted into the yaw rate 28 in an evaluation circuit 42 which is, if appropriate, also associated with the coriolis acceleration measuring pickup 36. An example as to how the yaw rate 28 can be sensed on the basis of a coriolis force field 38 is described in document DE 10 2010 002 796 A1, which in incorporated by reference, for which reason a description will not be provided here for the sake of brevity. The sensed yaw rate 28 is also output to the signal conditioning circuit 34.

In the signal conditioning circuit 34, the lateral acceleration 26 and yaw rate 28 which are acquired in this way can be post-processed in order, for example, to reduce the noise band interval and to increase the signal strength. The lateral acceleration 26 and yaw rate 28 which are conditioned in this way can then be output to an interface 44 which then transmits the two acquired signals as vehicle movement dynamics data 16 to the controller 18. This interface 44 could be constructed, for example, on the basis of the PSI5 standard or the CAN standard.

Figure 3:
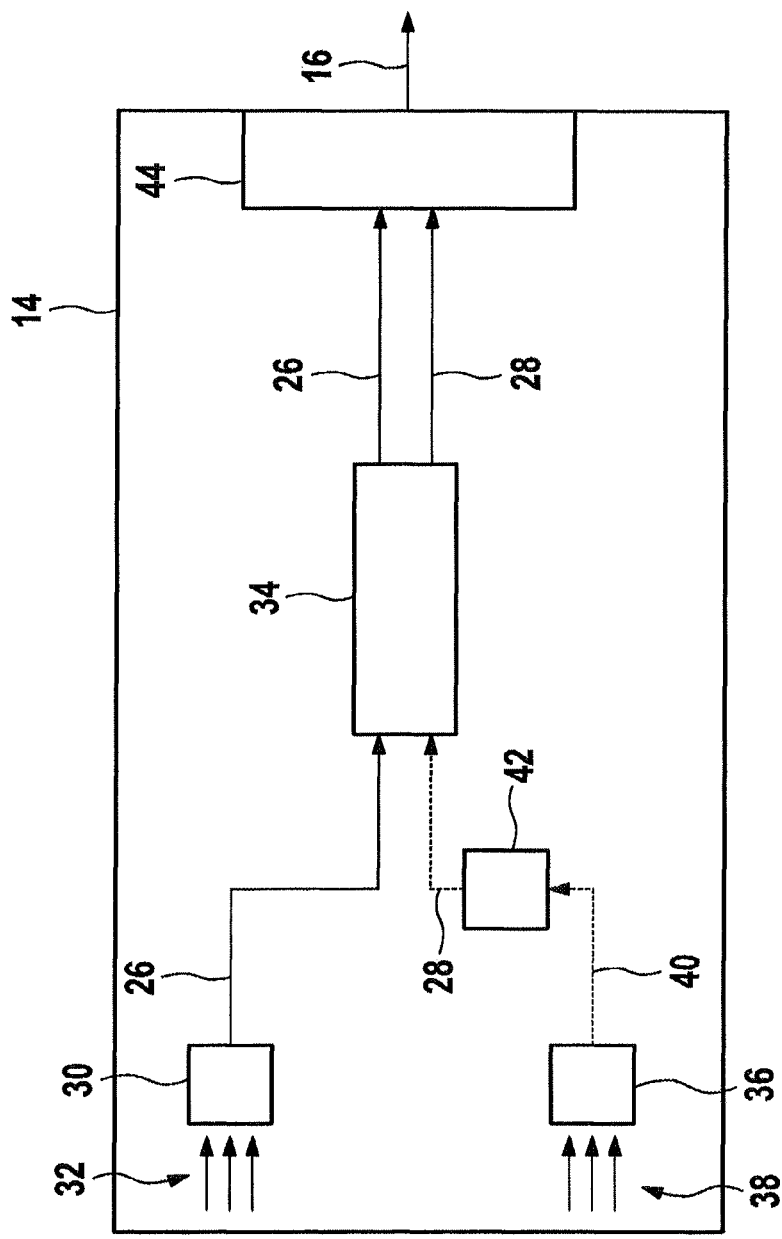
FIG. 3 shows an embodiment of the inertial sensor in FIG. 2 in a schematic sectional illustration.

An embodiment of the inertial sensor 14 will be explained in more detail below with reference to FIG. 3.

Within the scope of the present embodiment, the two measuring pickups 30, 36 and the signal conditioning circuit 34 form a sensor circuit 46 which is supported on and connected to a circuit carrier embodied as a leadframe 48. Under certain circumstances, connections which cannot be implemented on the leadframe 48 can be implemented here by means of electrical lines in the form of bonding wires 50. The interface 44 can be integrated into the signal conditioning circuit 34 and embodied as an application-specific integrated circuit, referred to as ASIC (application-specific integrated circuit) 34 below.

The sensor circuit 46 can also be encapsulated by a mechanical decoupling material 51, also referred to as globe top mass 51, in the form of a silicone material which can in turn be encapsulated conjointly in an injection molding press material 52, such as a thermoset in the form of an epoxy resin 52.

Finally, corresponding contact-forming means, such as small legs 54 shown in FIG. 2, for making electrical contact with a circuit such as, for example, the controller 18, project from the inertial sensor 14.

Figure 4:
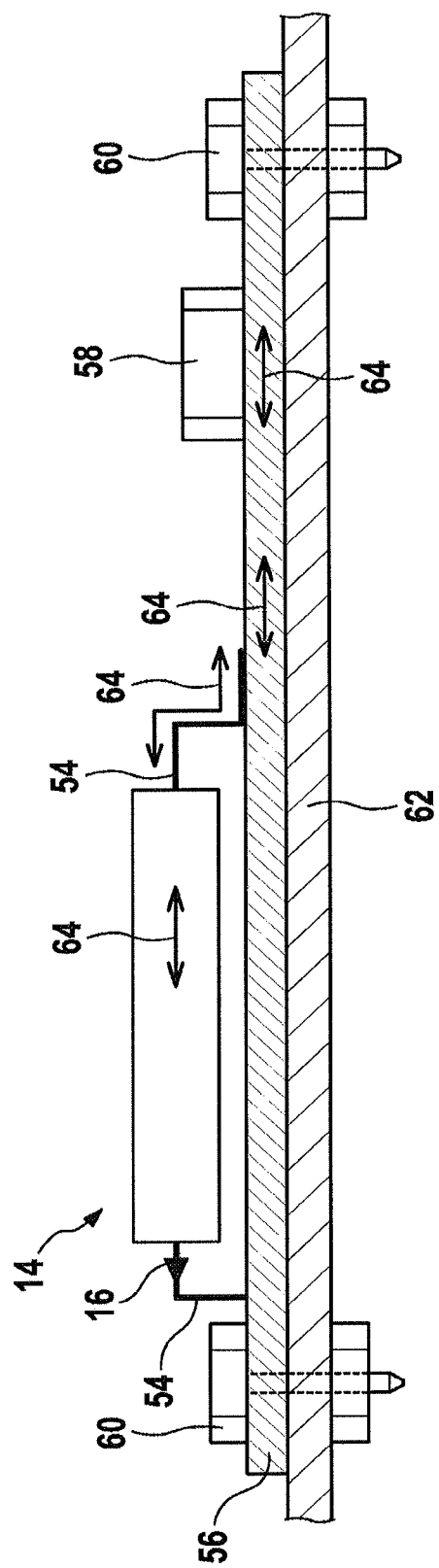
FIG. 4 shows the inertial sensor in FIG. 3 on a printed circuit board in a schematic side view.

Reference is made to FIG. 4 on the basis of which possible falsification of the vehicle movement dynamics data 16 is to be explained in more detail.

The inertial sensor 14 which senses the lateral acceleration 26 and/or the yaw rate 28 as vehicle movement dynamics data 16 could be soldered directly, using a reflow soldering process known per se, onto a printed circuit board 56 on which, for example, the controller 18 could also be implemented. Ceramic capacitors 58 could be additionally located on this printed circuit board 56. In addition, the printed circuit board 56 could be connected via a screwed-on attachment 60 to other technical elements in the vehicle 2 such as, for example, an electrical valve and/or a housing 62 which is indicated in FIG. 4.

It has become apparent that structure-borne noise 64, generated by connected capacitors, such as the ceramic capacitor 58 and/or the other technical elements such as the abovementioned electrical valve which can be embodied, for example, as a solenoid valve, and/or vehicle body oscillations of the chassis 4, can be conducted via the circuit board 56 and the small legs 54 to the leadframe 48 and from there to the measuring pickups 26, 28.

The structure-borne noise 64 excites the two measuring pickups 26, 28 to experience oscillations which are superimposed on the centrifugal force field 32 and the coriolis force field 38 and can therefore influence the lateral acceleration 26 to be sensed and/or the yaw rate 28 to be sensed. This superimposition of the transmitter fields 32, 38 can therefore give rise to a faulty sensor signal in the form of the vehicle movement dynamics data 16, which can in turn give rise to incorrect reactions of the controller 18.

Therefore, the oscillations which are excited by the structure-borne noise 64 should be avoided as far as possible.

This should be explained in more detail below with reference to FIG. 5 which shows the inertial sensor 14 in an alternative embodiment. The coriolis acceleration measuring pickup 36 has been omitted in FIG. 5 only for the sake of brevity and clarity.

Figure 5:
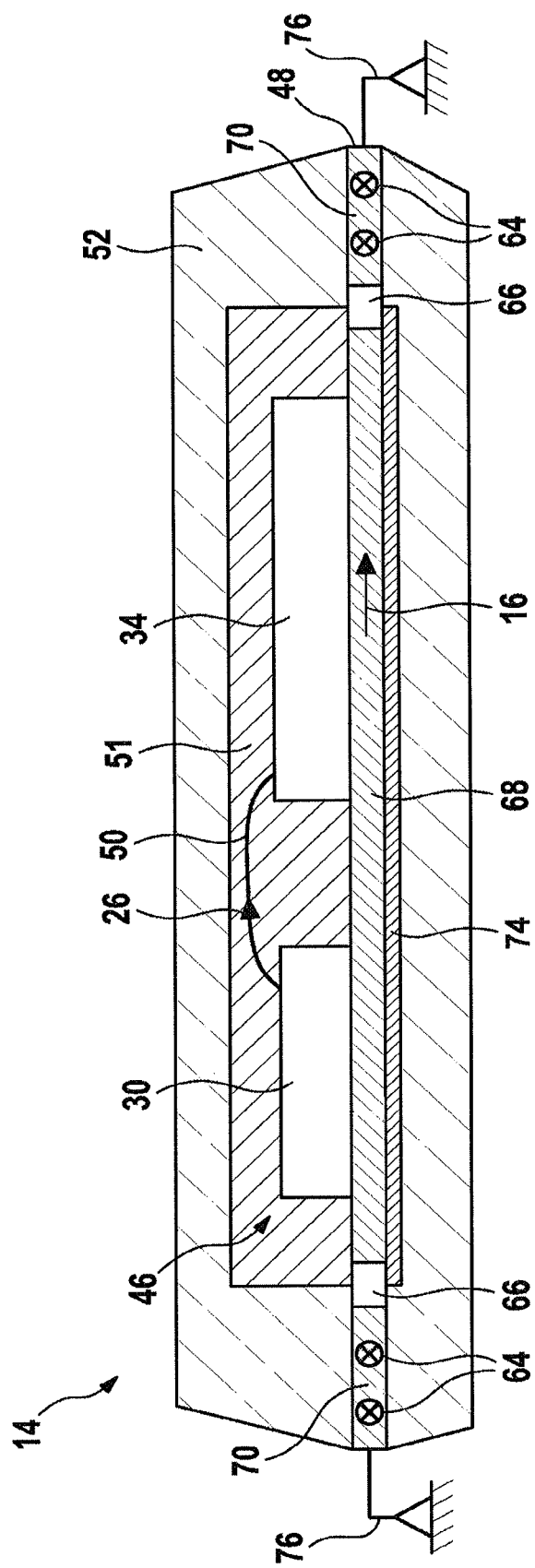
FIG. 5 shows an alternative embodiment of the inertial sensor in FIG. 2 in a schematic sectional illustration.

Within the scope of the inertial sensor 14 shown in FIG. 5, the oscillations which are excited by the structure-borne noise 64 are to be damped with a noise-resistance element 66. This noise-resistance element 66 is embodied as a slit 66, running around the sensor circuit 46, in the leadframe 48, with the result that the leadframe 48 is divided into a first region 68 and a second region 70. The two regions 68, 70 can be connected to one another here via thin webs 72, such as can be seen, for example, in FIG. 7.

The printed circuit board 48 is supported on a noise-decoupling film 74 underneath the sensor circuit 46, wherein the noise-decoupling film 74 and the globe top material 51 can be in contact in the slit 66 which runs around. The second region 70 of the leadframe 48 is fixedly connected to the printed circuit board 56 via the small legs 54 which are not indicated in FIG. 5, and this is indicated by fixed bearings 76. In contrast, the first region 68 of the first region 68 is mounted in a floating fashion by the slit 66 which runs around, with the result that said first region 68 cannot be excited to oscillate by the structure-borne noise 64. Consequently, the measuring pickups 30, 36 cannot be excited to oscillate either and the vehicle movement dynamics data 16 can be falsified.

Figure 6:
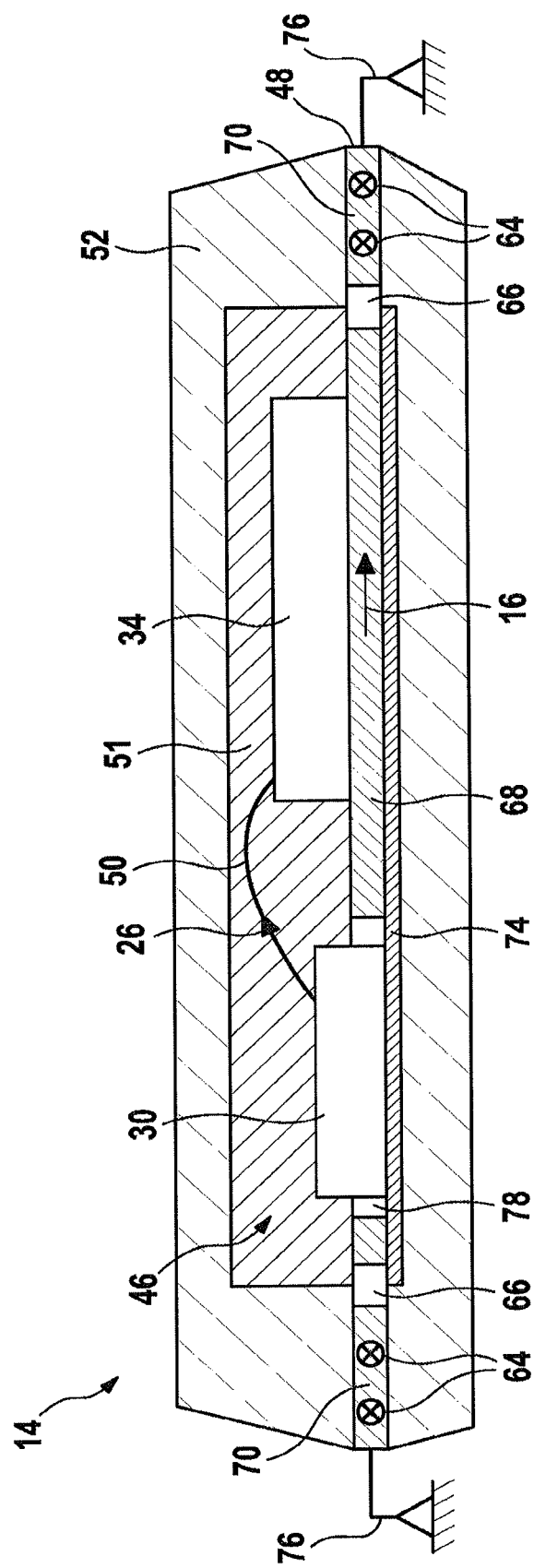
FIG. 6 shows a further alternative embodiment of the inertial sensor in FIG. 2 in a schematic sectional illustration.

In order to increase the noise decoupling further, as shown in FIG. 6 on the basis of the lateral acceleration measuring pickup 30, the measuring pickups 30, 36 can be arranged directly on the noise-decoupling film 74. For this purpose, a corresponding recess 78, in which the corresponding measuring pickup 30, 36 can then be accommodated, can be formed in the first region 68 of the leadframe 48.

Figure 7:
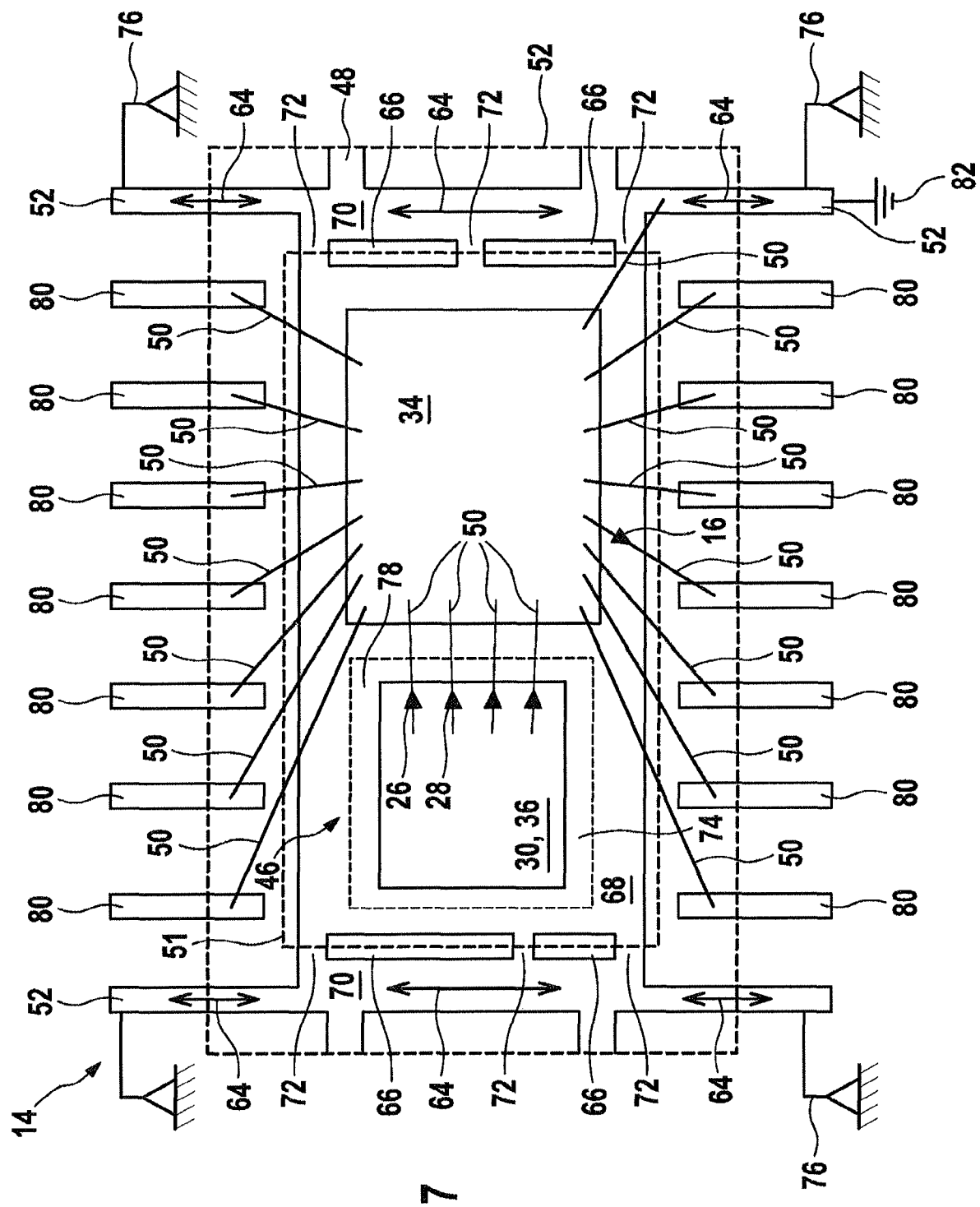
FIG. 7 shows yet another alternative embodiment of the inertial sensor in FIG. 2 in a schematic plan view.

As shown in FIG. 7, the individual measuring pickups 30, 36 can be accommodated in a single measuring pickup circuit, wherein the signal conditioning circuit 34 outputs the individual vehicle movement dynamics data items 16, acquired in this way, to electrical interfaces 80 via bonding wires 50. In addition, the leadframe 48 can be connected to a reference potential 82, for example at one of the fixed bearings 76.

The invention claimed is:

1. A sensor for sensing an acceleration, comprising:
 a sensor circuit for sensing the acceleration and for outputting a sensor signal which is dependent on the acceleration,
 a circuit carrier having a first region, the first region having a first side on which at least a first part of the sensor circuit is positioned, and a second region in which at least a first mechanical interface and a second mechanical interface for connecting the circuit carrier to a retainer are arranged,
 a noise-resistance element embodied as a slit which is arranged between the first region and the second region and is configured to conduct structure-borne noise entering via the first mechanical interface to the second mechanical interface, a mechanical decoupling element which encapsulates the first region of the circuit carrier and the sensor circuit, and which does not extend into the slit, and a noise-decoupling film positioned in direct contact with a second side of the first region of the circuit carrier opposite the first side of the first region of the circuit carrier, wherein at least a second part of the sensor circuit is supported on and in direct contact with the noise-decoupling film, the second part of the sensor circuit comprising one or more measuring pickups of the sensor circuit, the second part of the sensor circuit accommodated within a recess in the first region of the circuit carrier, the recess separating and intervening between the second part of the sensor circuit and the first part of the sensor circuit.

2. The sensor as claimed in claim 1, wherein the circuit carrier is embodied as a leadframe.

3. The sensor as claimed in claim 2, wherein the slit is designed to run around the first region, and the second region is connected to the first region via at least one web.

4. The sensor as claimed in claim 1, wherein the mechanical decoupling element comprises a globe top mass.

5. The sensor as claimed in claim 1, wherein the first region of the circuit carrier is accommodated between the globe top mass and the noise-decoupling film.

6. The sensor as claimed in claim 1, wherein an electrical reference potential is applied to at least one of the two mechanical interfaces.

7. The sensor as claimed in claim 1, further comprising a protective mass which encloses the sensor circuit, the first region of the circuit carrier and at least part of the second region of the circuit carrier.

8. The sensor as claimed in claim 1, wherein the recess is bounded on all lateral sides by the first region of the circuit carrier.

9. The sensor as claimed in claim 1, wherein an entirety of the first part of the sensor circuit is supported by and in direct contact with the first side of the first region of the circuit carrier.

* * * * *